United States Patent [19]

Morita et al.

[11] Patent Number: 5,753,966
[45] Date of Patent: May 19, 1998

[54] SEMICONDUCTOR DEVICE WITH CLEAVED SURFACE

[75] Inventors: Etsuo Morita; Hiroji Kawai, both of Kanagawa, Japan

[73] Assignee: Sony Corporation, Tokyo, Japan

[21] Appl. No.: 772,066

[22] Filed: Dec. 19, 1996

[30] Foreign Application Priority Data

Dec. 25, 1995 [JP] Japan ................................ 7-337192
Dec. 28, 1995 [JP] Japan ................................ 7-343813

[51] Int. Cl.[6] .......................... H01L 29/04; H01L 31/036
[52] U.S. Cl. .......................... 257/627; 257/94; 257/200; 257/352; 372/44; 372/45
[58] Field of Search .......................... 257/94, 200, 352, 257/507, 627; 372/44

[56] References Cited

U.S. PATENT DOCUMENTS 5,604,763  2/1997  Kato et al. ................................ 372/45

OTHER PUBLICATIONS

Japanese application No. 8-153931, published Jun. 11, 1996 and English abstract.

Primary Examiner—Sara W. Crane
Assistant Examiner—Douglas A. Wille
Attorney, Agent, or Firm—Hill, Steadman & Simpson

[57] ABSTRACT

A semiconductor light emitting device is prepared by the steps of forming a semiconductor layer 2 having a laminated structure containing at least a first cladding layer 6, a light emitting layer 7, and a second cladding layer 8 on a substrate 1 having {11-20} plane (plane a) as the main plane; and breaking integrally the semiconductor layer 2 and the substrate 1 under a heating condition to form a pair of facets on the above described substrate due to the plane which was cleaved in {1-102} plane (plane r) and at the same time, to form a pair of facets 3 extending along the above described pair of facets of the substrate 1 on the semiconductor layer 2.

8 Claims, 4 Drawing Sheets

SEMICONDUCTOR DEVICE WITH CLEAVED SURFACE

BACKGROUND OF THE INVENTION

1. Field of the Invention

The present invention relates to a semiconductor device and particularly to a light emitting device, such as a semiconductor laser, having a cleaved surface.

2. Description of the Related Art

To generate an inductive emission in a semiconductor device such as a compound semiconductor laser, a pair of optical facets are required to enclose the light on the two sides of the light emitting area and to form a resonator between the facets.

These facets are formed generally by a cleaved surface which is perpendicular to a crystal substrate or to a semiconductor layer that is epitaxially grown on the crystal substrate, the cleaved surface being formed using the cleavage plane of the crystal. In this case, a scratch is formed by marking on the front surface of a semiconductor layer or on the reverse side of a substrate to determine a point where the cleavage is started. The facet could be formed by other methods, for example, RIE (reactive ion etching) or chemical wet etching. In general, a facet formed by these etching methods, is optically inferior to a cleaved facet. Also, the etching process is very complicated and has an adverse effect on mass productivity.

When cleavage is used as mentioned above, the thickness of the substrate on which a semiconductor layer is epitaxially grown is considerably larger than that of the epitaxially-grown semiconductor layer. For this reason, the ease with which the substrate is cleaved is especially important. GaAs or other materials, which are cleaved easily, is used as a substrate for a semiconductor laser formed of the III-V group such as AlGaAs or AlGaInP or II-VI group such as ZnSSe or ZnCdSe which are widely used or under development. Therefore, the resonator facets can be formed by being cleaved.

In view of the fact that a short wavelength light emission is required of a semiconductor light emitting device such as a semiconductor laser, a semiconductor laser using a III-V compound semiconductor containing a III-group element of {Ga, Al, In} and a V-group element of N (nitrogen), which is capable of emitting in the blue to ultra-violet range, is attractive. In this case, epitaxial growth of a {Ga, Al, In}—N compound semiconductor layer using an $MgAl_2O_4$ or an LGO (that is, $LiGaO_2$) crystal as a substrate, which is capable of utilizing the cleavage characteristics of the material, has been attempted.

Suppose a compound semiconductor layer containing any one of {Ga, Al, In} and N is grown epitaxially on a sapphire substrate to form an intended semiconductor laser, for example. Due to the lack of a cleavage plane in the sapphire substrate that is coincidental with a cleavage plane of the compound semiconductor layer, it is difficult to form a facet by cleavage unlike in the above-mentioned case.

SUMMARY OF THE INVENTION

An object of the present invention is to provide a semiconductor device, in which a semiconductor laser or the like with a semiconductor layer of GaN or the like III-V compound is configured using a substrate lacking a cleavage plane coincidental with that of the semiconductor layer or a substrate having a difficulty in cleavage or having a cleavage plane different from the easily-cleaved plane of the semiconductor layer, so that the breakage or cleavage is conducted easily and accurately along the cleavage plane of the semiconductor layer.

According to the present invention, there is provided a semiconductor device comprising a substrate and at least one layer composed of compound semiconductor containing N and at least one of the elements selected from {Ga, Al, In} on the substrate, wherein the substrate having a pair of facets of {1-102} planes or a plane within ±5 degree off from the {1-102} plane.

According to the present invention, even if a plane of the substrate does not coincide with that of the semiconductor layer, it is possible to form a pair of facets, which has excellent cleavage characteristics, in the semiconductor layer which has epitaxially grown on the substrate. The pair of facets can be defined in the semiconductor layer on the substrate, whereby these facets are utilized as a resonator of a semiconductor light emitting device. As a result, a semiconductor light emitting device, such as a semiconductor laser of the like, having excellent light emitting characteristics can be produced.

According to the invention, a plane substantially equivalent to the {11-20} plane or {1-102} plane, such as a plane inclined about 5 degree from the {11-20} plane or {1-102} plane is also regarded as a {11-20} plane or {1-102} plane, respectively.

DETAILED DESCRIPTION OF THE PREFERRED EMBODIMENT

Figure 1:
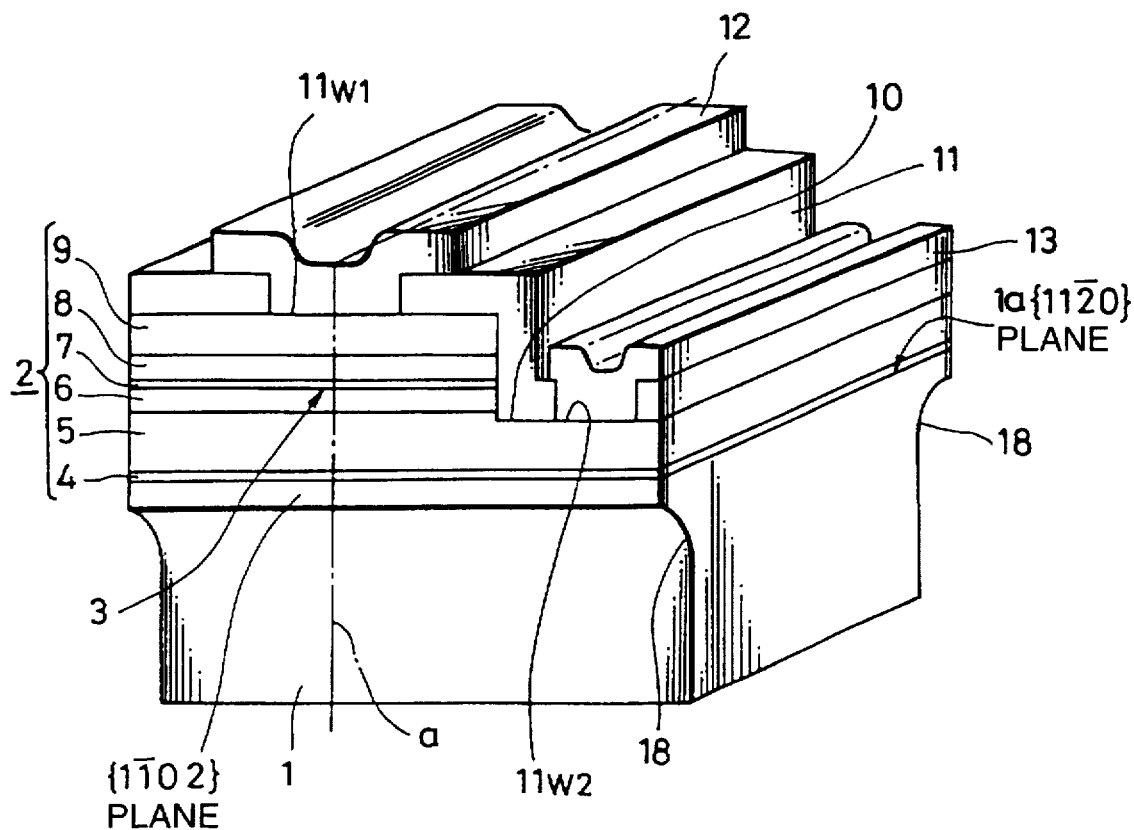
FIG. 1 is a schematic perspective view showing an example of the semiconductor device according to the present invention.

An embodiment of the present invention will be described. FIG. 1 is a perspective view schematically showing an example of a semiconductor device according to the invention.

According to the invention, a compound semiconductor layer 2 containing at least one of the elements {Ga, Al, In} and N (i.e. GaN-group semiconductor) is formed on a substrate 1. This example represents an application of the invention to a GaN-group semiconductor laser, in which case a semiconductor layer 2 constituting a GaN-group semiconductor light-emitting device such as a semiconductor laser, at least a first cladding layer 6, a light emitting layer, e.g., an active layer 7, and a second cladding layer 8 is formed on the substrate 1 made of sapphire or the like.

Particularly in the present invention, the sapphire substrate 1 is composed of a substrate having a main surface 1a of {11-20} plane, i.e., <plane a>, the semiconductor layer formed thereon, and {1-102} plane, i.e., <plane r> which is perpendicular to <plane a>.

To facilitate the understanding of the device of the invention, an example method of fabricating a semiconductor device according to the invention will be explained with reference to the perspective views of FIGS. 2 to 4. As shown in the sectional view of FIG. 2 taken along the broken line of FIG. 1, a buffer layer 4 of GaN is epitaxially grown by 30 nm, for example, as required on the {11-20} plane (which is shown in the drawings as plane 11-20) of the main surface 1a of the sapphire substrate 1. Then, using the same epitaxial growth steps as above, there are formed on the substrate 1, a first conductivity type, for example, an n-type electrode contact layer 5 about 3 μm thick doped with n-type impurities Si, an n-type first cladding layer 6 having a thickness of about 0.5 μm made of AlGaN doped with n-type impurities Si, an active layer 7 about 0.05 μm thick made of an GaN low in n type impurities concentration or non-doped, a second cladding layer 8 of about 0.5 μm made of AlGaN doped with p-type impurities Mg as a second conduction type, and a cap layer 9 of about 1.0 μm in thickness made of GaN doped with p-type impurities Mg. These semiconductor layers 3 to 9 can be epitaxially grown by MOCVD (Metal Organic Chemical Vapor Deposition) or MBE (Molecular Beam Epitaxy).

Figure 2:
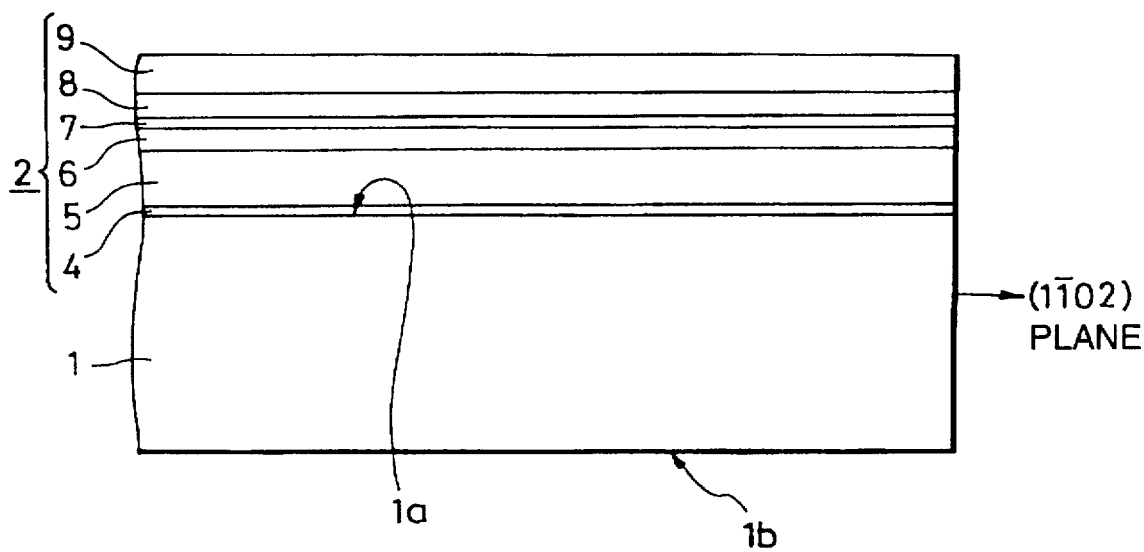
FIG. 2 is a sectional view showing an example of the process for the production of a semiconductor device in one step thereof according to the present invention.
Figure 3:
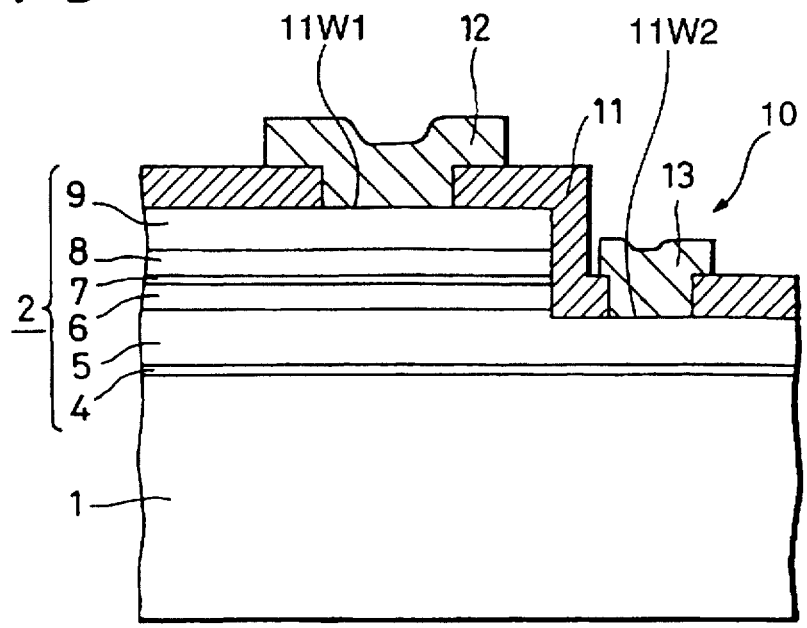
FIG. 3 is a sectional view showing an example of the process for the production of a semiconductor device in one step thereof according to the present invention.

As shown in FIG. 3 representing a section perpendicular to the section of FIG. 2, an electrode contact groove 10 is formed in stripes for removing a part of the layers 6–9 and exposing a part of the electrode contact layer 5 in a direction at an angle to or perpendicular to the aforesaid <plane r> by chemical wet etching or dry etching such as RIE from the surface of the cap layer 9. An insulating layer 11 of SiO$_2$ or the like is formed by sputtering or CVD (Chemical Vapor Deposition) over the entire surface of the cap layer 9 including the side and bottom surfaces in the groove 10. After that, an electrode contact window 11w1 is formed in a stripe along the extension of the groove 10, i.e., in a direction at an angle or perpendicular to the <plane r> on the insulating film 11 on the cap layer 9. The other electrode contact window 11w2 is formed in the insulating film 11 on the electrode contact layer 5 in the groove 10. The windows 11w1 and 11w2 are formed by pattern etching using photolithography, for example.

An Au electrode 12, for example, is deposited in ohmic on the cap layer 9 through the electrode contact window 11w1. On the other hand, a stack electrode 13 constituted metal layers of Ti, Al and Au are sequentially deposited in ohmic on the electrode contact layer 5 through the other electrode contact window 11w2. Then the whole assembly is annealed.

Figure 4:
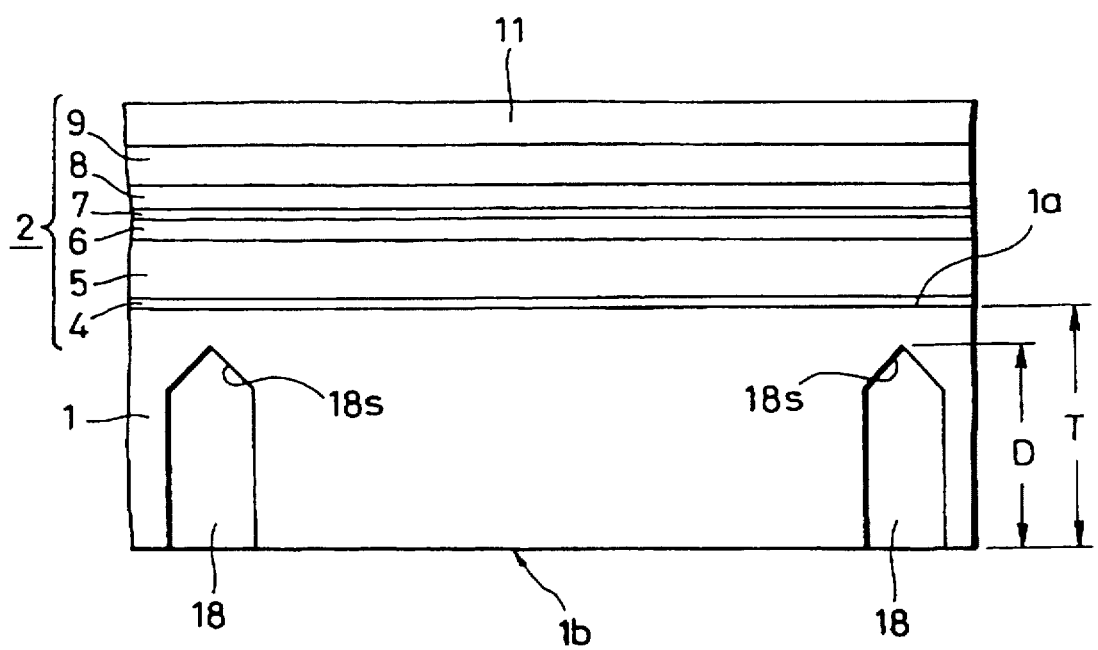
FIG. 4 is a sectional view showing an example of the process for the production of a semiconductor device in one step thereof according to the present invention.

As seen from FIG. 4 showing a sectional view in the same plane as FIG. 2, i.e., perpendicular to FIG. 3, two or more striped grooves 18 are cut along the direction parallel to the (1-102) plane or an equivalent {1-102} plane of the semiconductor layer 2. The grooves 18 can be formed by slicing, for example. The width of the opening of each of the grooves of the substrate surface 1b is as wide as 20 μm to 200 μm. A bottom section 18S of the groove 18 extending along the {1-102} plane of the substrate I is formed to concentrate the stress at the bottom of the groove.

The depth of the grooves 18 is such that the grooves 18 is not reached to the semiconductor layer 2. Assuming that the thickness of the substrate 1 is T and the depth of the substrate grooves D, then the relations are set to $0<T-D \leq 150$ μm, or $0<T-D \leq T/2$.

Figure 5A:
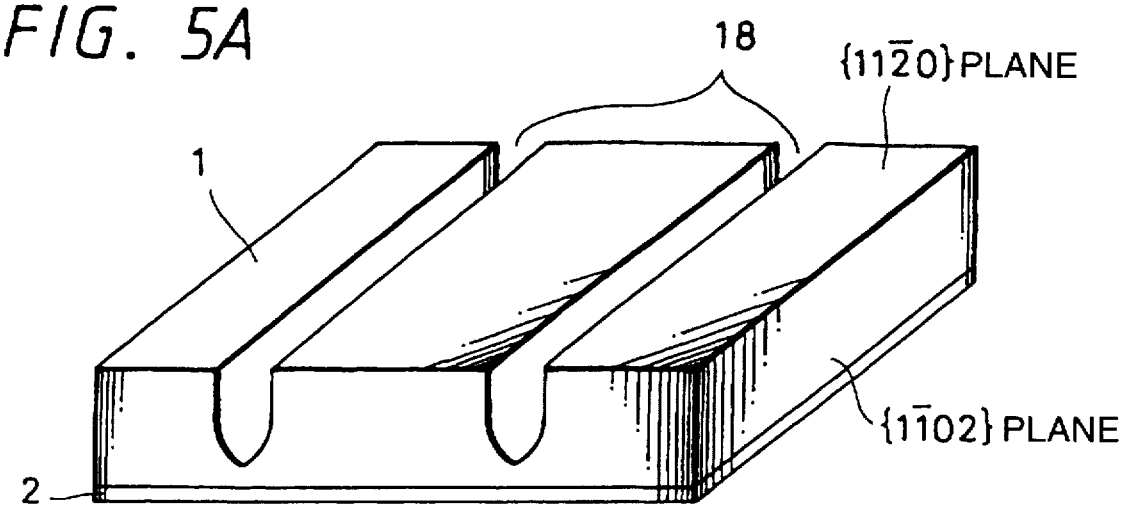
FIGS. 5A, 5B, and 5C are perspective views each showing an example of a profile of grooves defined on a substrate in accordance with the production process of the present invention.
Figure 5B:
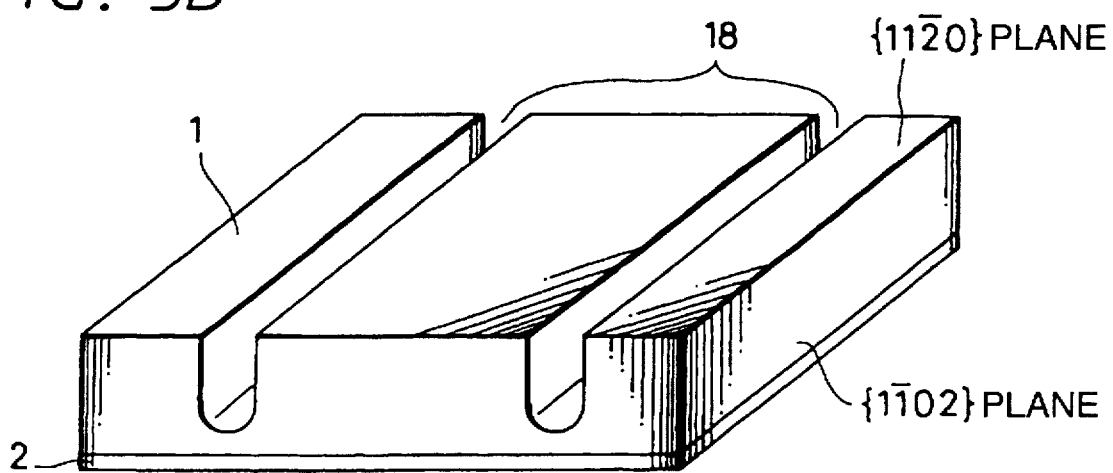
Figure 5C:
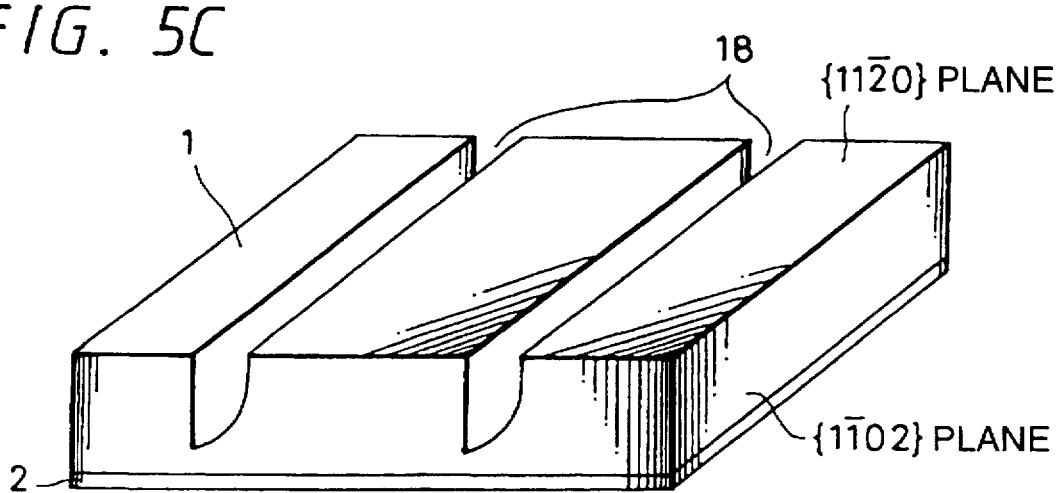

The sectional view of the grooves 18, as shown in the perspective views taken from the reverse side of the substrate 1 in FIG. 5, for example, may assume various shapes such as a V-shaped section as shown in FIG. 5A, a U-shaped section as shown in FIG. 5B or with a vertical side surface as shown in FIG. 5C. A sharp portion extending linearly along the {1-102} plane of the substrate 1 is formed in the bottom section 18S of the groove 18. Stress is concentrated in this sharp portion of the bottom section 18S.

After that, an external force is applied to the substrate 1 formed with the semiconductor layer 2 while applying a tension along the surface thereof. For example, an external mechanical stress, thermal stress or ultrasonic wave is exerted in such a manner as to bend the substrate 1. Doing so causes stress to be concentrated in the bottom of the grooves 18. Consequently, as shown in FIG. 1, the substrate 1 is broken along the grooves 18, with the result that the semiconductor layer 2 is also broken along the grooves 18 thereby to produce semiconductor chips, since the {1-102} plane of the sapphire substrate 1 is an easily cleaved plane. As a result, the semiconductor layer 2 which is remarkably thinner than the substrate 1 breaks. In this case, the thickness of the substrate 1 is several hundred μm, while that of the semiconductor layer is around several μm, so that the substrate 1 and the semiconductor layer 2 are integrally broken. More specifically, in the semiconductor layer 2, a pair of facets 3 which are clearly broken in coincident with the facets based on the <plane r> of the substrate 1 are defined.

In the meantime, it has been reported that the {1-102} plane, i.e., the <plane r> is that which is easily cleaved. (see S. M. Wiederhorn, Journal of the American Ceramic Society, 52(9), (1969) 485-91./E. Stofel and Hans Conrad, Trans. AIME, 227(5) (1963) 1053.)

Moreover, when the grooves 18 are defined in the substrate 1, and a stress is concentrated in the bottom thereof as mentioned above, the aforementioned cleavage of the <plane r> is more positively effected and in addition, it is practiced at prescribed positions established by the positions of the grooves 18.

This breakage may be conducted at a temperature higher than room temperature, preferably, 150° C. or higher, as near to the epitaxial growth temperature as possible at 300° C. or more where elasticity of the substrate 1 decreases but at a temperature lower than that for epitaxial growth of the semiconductor layer 2.

The reason why the breakage is preferably conducted at a temperature as near to the epitaxial growth temperature for the semiconductor layer 2 as possible will be explained. The substrate 1 and the semiconductor layer 2 are preferably broken integrally. In the case where an elastic strain exists due to lattice mismatch between the semiconductor layer 2 and the substrate 1, the substrate 1 and the semiconductor layer 2 are hard to break integrally. The temperature for epitaxial growth of the semiconductor layer 2 on the substrate 1 is generally considered to be the temperature where the strain due to the lattice mismatch is lowest. At a temperature near to the epitaxial growth temperature, therefore, the strain between the semiconductor layer 2 and the substrate 1 is small. At such a temperature, therefore, the semiconductor layer 2 and the substrate 1 are comparatively easily broken integrally with each other.

As described above, breakage with a low elasticity characteristic ensures that the breakage will extend continuously over the substrate 1 and the semiconductor layer 2.

It is already reported that the strength of sapphire becomes lowest by increasing the temperature to 300° to 600° C., for example. (A. H. Heuer and J. P. Roberts, "Temperature Dependence of the Strength of Corundum Single Crystals", American Ceramic Society Bulletin, 47(4) (1968) 354.))

Figure 6:
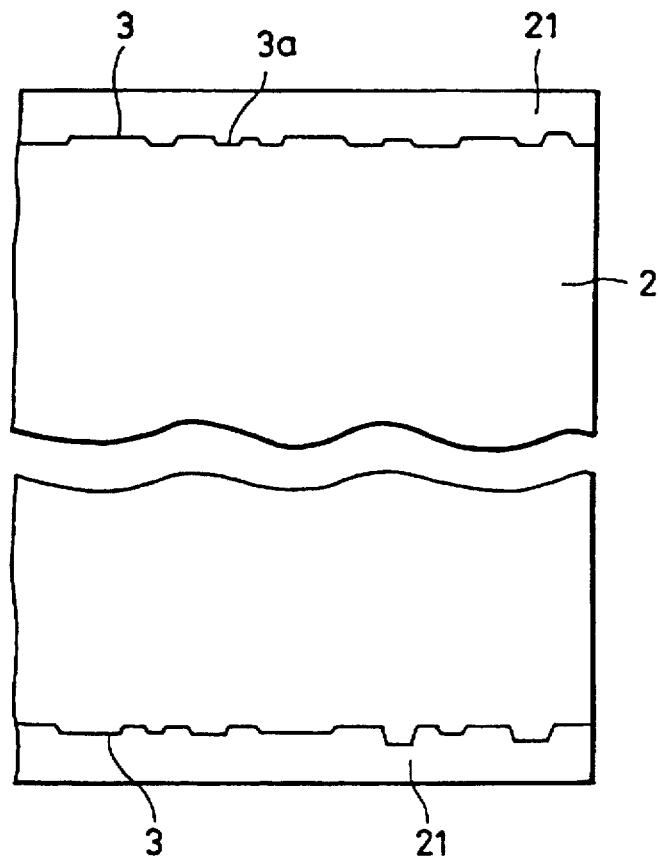
FIG. 6 is a schematic sectional plan view in one step of one example of the manufacturing method of the present invention.

The facet 3 that is thus formed provides an optically superior flat surface. Nevertheless, as shown in FIG. 6 with a schematic sectional plan view of the semiconductor layer 2, a minute unevenness may occur due to atomic steps. Thus, to achieve a smooth mirror face of the surface by filling the minute irregularities 3a, an insulating surface layer 21 is formed on the facet. The surface layer 21 is clad at least across that portion of the facet that acts as the resonator, that is, the surface layer 21 is coated on at least the end face of the active layer 7 that serves as a light emitting layer, and on the layers that limit light dispersion, for example, the first and second cladding layers 6 and 8.

The material of the surface layer 21 is formed by vacuum deposition, spattering, or a CVD method with, for example, aluminum-nitride AlN having a refraction factor equal or as close as possible to that of the active layer 7 and that of the layers that confine the light on both sides of the active layer, for example, at least one of the first and second cladding layers 6 and 8.

Figure 7:
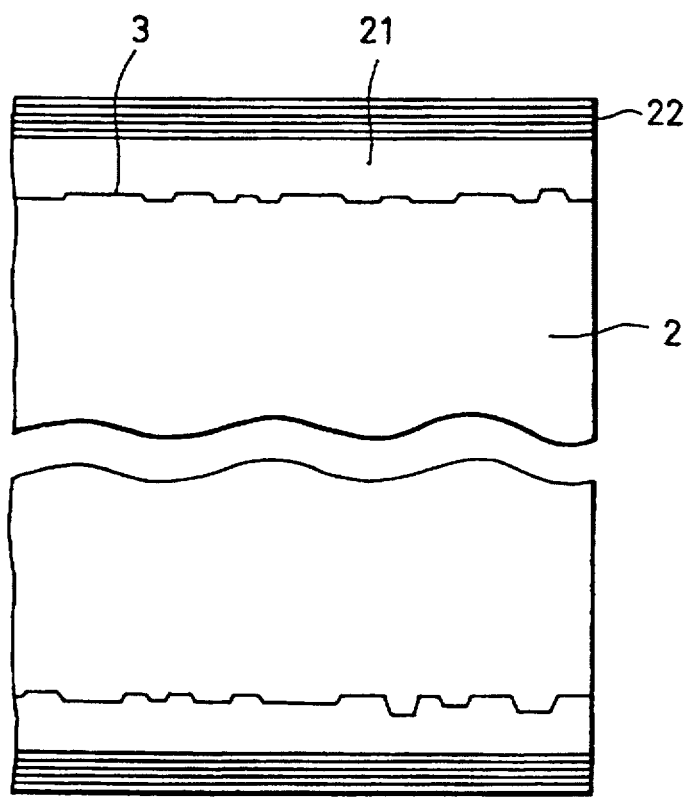
FIG. 7 is a schematic sectional plan view in one step of one example of the manufacturing method of the present invention.

Further, as shown in FIG. 7 with a similar schematic plan sectional view as in FIG. 6, the outer face of the surface layer 21 can be clad with a reflective multi layer 22 to increase the refraction factor on the end face 3.

In this way, a semiconductor laser according to the present invention is produced.

As described above, according to this invention, the facets 3 are formed along the grooves 18 formed in the substrate 1. The intervals between adjacent grooves 18, therefore, are selected in a manner to correspond to the length of the resonator of the finally-formed semiconductor laser.

In a semiconductor device according to this invention described above, the facets 3 of the semiconductor layer 2 constituting the resonator are formed by cleavage of the semiconductor layer 2. An optically superior flat surface can thus be formed. Further, as described above, in the case where an insulating film having a similar refractive index as the semiconductor layer 2 is formed on the end surfaces, the minute misalignment, which may be caused by atomic steps, i.e., in the material of the cleaved surfaces, can be formed into a smooth surface. The actual end surfaces (the reflection surfaces on the two ends) of the resonator can thus be formed as superior flat surfaces.

The drawings show the case in which the grooves 18 extend in parallel in one direction on the substrate 1. In the actual fabrication process of a semiconductor laser, however, circuit chips formed by dividing the substrate 1 are produced not only by breakage in the direction perpendicular to the length of the resonator, i.e., in such a direction as to form the facets 3, but also by breakage along the direction parallel to such a direction. For this reason, grooves similar to the grooves 18 are formed in the substrate 1 at intervals corresponding to the chip width, i.e., at predetermined intervals in the direction perpendicular to the grooves 18. In this case, the semiconductor layer 2 may be broken in a plane that is hard to cleave. Since such as broken surface does not constitute the facets of the resonator, however, it is not required to be an optically superior surface and has no effect on the characteristics of the semiconductor laser.

As described above, according to this invention, the substrate 1, if made of sapphire, easily succumbs to cleavage. In spite of this, breakage along a predetermined direction can be positively accomplished by forming the grooves 18 and thereby causing stress to be concentrated by appropriately selecting the sectional shape. The grooves 18 are thus formed along a plane that is easy to cleave in the semiconductor layer 2 above the substrate 1. In this way, at least the resonator can be formed in a predetermined crystal plane, i.e., in an easy-to-cleave surface of the semiconductor layer 2 without using the cleavage plane of the substrate 1.

Consequently, the invention is not limited to the above-mentioned sapphire substrate but is applicable also to substrates which do not easily succumb to cleavage. In other words, the invention is not limited to the AlGaN-group semiconductor layer 2 constituting a semiconductor light-emitting device as in the above-described example.

The semiconductor layer 2 is configured of a compound semiconductor layer containing at least one of the elements {Ga, Al, In} and N. In the case where the surface layer 21 is deposited on the facets 3 for flattening the facets 3, the refractive indexes n of each semiconductor layer are 2.67 for GaN, 2.15 for AlN, and 2.85 to 3.05 for InN. In view of this, the surface layer 21 formed on the facets 3 is formed by vacuum vapor deposition, sputtering or CVD of AlN, GaN, InN, AlGaN or InGaN film having an intermediate value of refractive index at 1.5 to 3.05.

The foregoing explanation refers to a semiconductor laser of, what is called, a double heterostructure type in which an active layer is positioned between cladding layers. The invention, however, is not limited to the above-mentioned semiconductor laser, but can be equally applied to what is called SCH (Separate Confinement Heterostructure) with an optical guide layer interposed between the active layer and the cladding layer. Various configurations, therefore, are possible using a semiconductor laser or a light-emitting diode.

As mentioned above, according to the above described embodiment, the substrate 1 is a sapphire substrate and a semiconductor layer 2 which is disposed on the substrate 1 is a compound semiconductor containing at least one element of {Ga, Al, In} and N, and it is adapted to break both the materials in a plane where there is a cleavage capability with respect to the substrate 1, even if cleavage planes of both the materials do not coincide with each other, whereby the substrate 1 and the semiconductor layer disposed thereon are integrally broken. Accordingly, the facet 3 can be formed into a flat plane the surface properties of which are far better than that of, for example, a plane prepared by means of a etching process. In addition, the production process is simplified, and the process is excellent in reproducibility, besides a semiconductor device having target properties such as a semiconductor laser can reliably produced.

Although other modifications and changes may be suggested by those skilled in the art, it is the intention of the inventors to embody within the patent warranted hereon all changes and modifications as reasonably and properly come within the scope of their contribution to the art.

We claim:

1. A semiconductor device, comprising:
   a substrate; and
   at least one layer composed of a semiconductor compound containing N and at least one of the elements selected from {Ga, Al, In} on said substrate;
   said substrate having a pair of facets within 5 degree of the {1-102} plane of said substrate.

2. A semiconductor device as described in claim 1, wherein said at least one layer having a pair of facets which is parallel to said facets of said substrate.

3. A semiconductor device as described in claim 2, wherein said pair of facets of said at least one layer is a resonator of a semiconductor light emitting device.

4. A semiconductor device as described in claim 1, wherein said substrate is of sapphire.

5. A semiconductor device as described in claim 1, wherein said substrate has a main surface of {11-20} plane.

6. A semiconductor device as described in claim 2, further comprising:

an insulating film on said facet of said at least one layer, having a refractive index substantially similar to that of said semiconductor compound.

7. A semiconductor device as described in claim 6, wherein said insulating film essentially consists of a material of at least one element selected from the group consisting of Al, Ga, and In in combination with N.

8. A semiconductor device, comprising:

a sapphire substrate having a main surface in a {11-20} plane; and at least one layer of GaN on said main surface of said substrate;

said substrate having a pair of facets within 5 degree of a {1-102} plane of the substrate.

* * * * *